(12) United States Patent
Reith et al.

(10) Patent No.: US 6,404,019 B1
(45) Date of Patent: Jun. 11, 2002

(54) SENSE AMPLIFIER

(75) Inventors: Armin M. Reith; Tina Leidinger, both of Munich (DE); Gunther Lehmann, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 14 days.

(21) Appl. No.: 09/676,870

(22) Filed: Sep. 29, 2000

(51) Int. Cl.[7] ............................................. H01L 29/94
(52) U.S. Cl. ...................... 257/368; 257/369; 257/390; 257/401; 257/618; 257/653; 257/202; 257/206
(58) Field of Search ..................... 257/368–369, 257/390, 395–397, 401, 618, 622, 653, 202, 204, 206; 365/51

(56) References Cited

U.S. PATENT DOCUMENTS 5,144,388 A  9/1992  Sawada et al. .............. 257/394
5,341,013 A  8/1994  Koyanagi et al. ........... 257/368
5,389,810 A  2/1995  Agata et al. ................. 257/369
6,240,005 B1 * 5/2001  Chrysostomides et al. .... 365/51

* cited by examiner

Primary Examiner—Minh Loan Tran
Assistant Examiner—Thomas L. Dickey

(57) ABSTRACT

A sense amplifier for use with a dynamic random access memory is formed in a silicon integrated circuit. The pitch of an array of such sense amplifiers is equal to the pitch of pairs of bit lines of a memory array. Each array of sense amplifiers is formed from four rows of transistors of a given n or p-channel type Metal Oxide Semiconductor (MOS) transistor having a U-shaped gate electrode. The gate electrode of the transistors in each row of transistors of the sense amplifier is offset from those in a previous row by a preselected amount. The bit lines passing through the sense amplifier are straight, with no offsets to affect photolithographic performance, and no protuberances to increase the capacitance of the bit lines. Such an array of sense amplifiers has a size equivalent to the minimum size of the pairs of bit lines, and thus does not cause any increase in the width of the array of memory cells.

31 Claims, 8 Drawing Sheets

SENSE AMPLIFIER

FIELD OF THE INVENTION

This invention relates to the design and manufacture of integrated circuit devices including memory and random access memory, and more particularly, to the design of transistors in a support area of the memory which allows support circuits, such as sense amplifiers, to be designed with a width commensurate with the width of the memory cells.

BACKGROUND OF THE INVENTION

There is a continuing trend towards increasing the capacity and speed, and decreasing the cost of dynamic random access memory (DRAM) fabricated in semiconductor integrated circuits. Such an increase in capacity and decrease in cost is best achieved by decreasing the area of the memory cells, and by decreasing the size of the support circuitry, sense amplifiers and addressing circuitry, to be commensurate with the smaller size of the memory cells.

In a typical DRAM memory cells are arranged in an array, which in most designs consumes a major portion of the area of the DRAM semiconductor integrated circuit. FIG. 1 shows a schematic block diagram of a prior art memory 100 having individual memory cells 110 arranged in a top array 120 and a bottom array 130. Word lines 140 run horizontally, and pairs of bit lines 150 run vertically, across the arrays 120, 130 of memory cells 110, and are coupled to the memory cells 110. When one of the word lines 140 is selected, the memory cells 110 in a given row are accessed and connected to the corresponding pair of bit lines 150. The pairs of bit lines 150 run vertically through both the top array 120 and the bottom array 130 of memory cells 110 and connect to the sense amplifiers 160, which are typically located centrally between the two arrays 120 and 130. The largest portion of the surface area of a memory circuit 100 is devoted to the two arrays 120 and 130 of memory cells 110. The size of a memory circuit 100 is thus directly proportional to the size of the arrays 120 and 130 of memory cells 110. The size of the memory cells 110 can be characterized by the horizontal pitch, or distance from cell-to-cell, of the memory cells 110. If the size or pitch of the sense amplifiers 160 is greater than that of the memory cells 110, the sense amplifier 160, rather than the memory cell 110, will be the determining factor in the size of the complete memory circuit 100.

Various techniques have been used to decrease the size of the memory cells, including the use of exotic high dielectric constant insulator materials in the storage capacitors, the use of vertical structures for the storage capacitors and access transistors, and the use of particular shapes and layouts for the active area of the memory cell. By the use of these techniques the horizontal size of an individual memory cell 110 has been reduced to the point where it is comparable with the size of the pair of bit lines 150. It is incumbent upon the circuit designer to be able to produce a sense amplifier 160 of equivalent width.

It is common practice to describe the size of a memory cell or sense amplifier in terms of the size of the smallest features which can be produced using the available photolithographic and pattern definition techniques. Such a minimum size feature is commonly denoted as F. The minimum pitch of the bit lines is denoted herein as P. If one assumes that the minimum width of a bit line, F, is equal to the space between the bit lines, then the pitch of a pair of bit lines will be 4F. Thus the size of the smallest memory cells described above is said to be 4F, or more generally, 2P, or less. The goal of the designers of sense amplifiers is to achieve a sense amplifier with a width of 2P, or less.

FIG. 2A shows a schematic circuit diagram a of prior art sense amplifier 200 fabricated in Complementary Metal Oxide Semiconductor (CMOS) transistor technology. The details of the operation of the circuit depicted in FIG. 2A is described in the existing literature. The circuit contains three n-channel Metal Oxide Semiconductor (MOS) transistors N1, N2, and N3, and three p-channel MOS transistors P1, P2, and P3, connected as shown in FIG. 2A. Two of the p-channel MOS transistors, P2 and P3, and two of the n-channel MOS transistors, N2 and N3, are connected to form a latch circuit. The remaining p-channel MOS transistor P1 is connected as a switch from a positive power supply 230 to sources of the two p-channel MOS latch transistors P2 and P3, and the remaining n-channel MOS transistor N1 is connected as a switch from the sources of the two n-channel MOS latch transistors N2 and N3 to a reference potential which is shown as ground 280. The switch transistors P1 and N1, respectively, are switched off and on by p-enable/disable and n-enable/disable signals (not shown) applied to gates 240 and 250, respectively, of transistors P1 and N1, respectively. The gates of the transistors P2 and N2, and P3 and N3, are connected to a Data Bit Line 260 and Reference Bit Line 270, respectively, as is shown. While one switch transistor, P1 or N1, is shown connected to a single pair of latch transistors, P2 and P3 or N2 and N3, respectively, the circuit can alternatively be implemented with a single pair of switch transistors supplying power and ground to multiple pairs of transistors of the latch circuit. The number of pairs of transistors of the latch circuit connected to a single switch transistor (P1 or N1) is a design parameter and is typically determined by the resistance of the interconnection (not shown) between the switch transistors and transistors of the latch circuit.

FIG. 2B is a representation of the circuit of FIG. 2A in which the circuit has been redrawn to segregate the p-channel MOS transistors (P1, P2, and P3) into one p-channel region 211 (shown in dashed lines), and the n-channel MOS transistors (N1, N2, and N3) into a second n-channel region 221 (shown in dashed lines). The reference numbers of the elements of FIG. 2A have been incremented by 1 for similar elements in FIG. 2B. The p-channel 211 and n-channel 221 portions of the circuit are symmetric. In the discussion of the layout of transistors herein below, we focus on a generic layout applicable to both the p-channel 211 and n-channel 221 sections of the sense amplifier. The depiction of a sense amplifier circuit as shown in FIG. 2B is more representative of the physical layout of an actual silicon integrated circuit than is the depiction shown in FIG. 2A, which is more related to the logical representation of the sense amplifier circuit.

If the size of the DRAM silicon integrated circuit is to be primarily determined by the size of the major component of the integrated circuit, i.e., the array of memory cells, it is incumbent upon the designers of the peripheral components, in this case the sense amplifiers, to make the peripheral component equal or smaller in size than the memory cell. Thus, one seeks ways to make the width of the sense amplifiers no larger that the width of the memory cell, or no larger than the size of a pair of bit lines.

Prior art describes the design of a sense amplifier which uses rows of field effect transistors having a U-shaped gate. Typically such sense amplifiers have a width of greater than 3.5P. This is significantly greater than the size of memory cells which can be fabricated using present memory cell technology, which, as described above, is approximately 2P.

It is desirable to have a sense amplifier which has a width, or pitch, comparable to that of the smallest memory cells which can be produced. Further, it is desirable to have a sense amplifier which does not introduce extra capacitance onto the bit lines. Furthermore, it is desirable to have a sense amplifier which has a simple repetitive, structure, and which does not significantly compromise the cost of the integrated circuits by negatively impacting the photolithographic yield of the integrated circuit.

SUMMARY OF THE INVENTION

The present invention is directed to a sense amplifier used in semiconductor integrated circuit memory devices in which the pitch (lateral size) of the sense amplifiers is made to match the pitch of the smallest memory cells. This is made possible through the use in the sense amplifier of a U-shaped gate design and the innovative use of four rows of transistors which are laterally offset from one another by a unique amount described herein below. In addition to the small size of the sense amplifiers resulting from the use of the methods described in this invention other advantages which accrue from the use of the described layout are: the use of highly replicated shapes which allow for advantages in the lithography; the ability to fabricate the bit lines using a single level of metal which has the ability to improve the yield of the fabricated integrated circuits; and the ability to design the bit lines as straight, non-meandering, lines, reducing the area of the bit lines and reducing the capacitance of the bit lines and allowing for advantages in photolithography.

From one aspect the present invention is directed to a semiconductor structure. The semiconductor structure comprises two rows of field effect transistors and first and second isolation regions. In the two rows of field effect transistors each transistor has output regions of a first conductivity type separated by portions of a semiconductor body of a second opposite conductivity type and having a U-shaped gate electrode separated from a top surface of the semiconductor body by a dielectric layer. The first and second isolation regions extend from the top surface of the semiconductor body into same and are separated by a first portion of the semiconductor body in which active portions of the transistors exist. Each U-shaped gate electrode has right and left arms and a central portion which connects a right arm portion to a left arm portion. Each of the right and left arms has an end portion and a middle portion with the middle portion being adjacent the central portion. The end portions of the right and left arms of the U-shaped gate electrodes of the first row are located over portions of the first isolation region, and the middle portions of the right and left arms of the first row and the central portions of the first row being located over the first portion of the semiconductor body. The end portions of the right and left arms of the U-shaped gate electrodes of the second row being located over portions of the second isolation region, and the middle portions of the right and left arms of the second row and the central portions of the second row being located over the first portion of the semiconductor body. The U-shaped gate electrodes of the second row of transistors are displaced from the U-shaped gate electrodes of the first row with a left arm of a gate electrode of a transistor of the second row being located below a right arm of a gate electrode of a transistor of the first row and a right arm of a gate electrode of a transistor of the second row being located below a left arm of a gate electrode of a transistor of the first row.

From a second aspect, the present invention is directed to a semiconductor structure. The semiconductor structure comprises a semiconductor body of a first conductivity type, a semiconductor region of a second opposite conductivity type being located within a portion of the semiconductor body, a first set of four rows of field effect transistors, first, second, and third isolation regions, a second set of four rows of field effect transistors, fourth, fifth, and sixth isolation regions, conductive lines, and an array of memory cells. The first set of four rows of field effect transistors is located in a portion of the semiconductor body not occupied by the semiconductor region with each transistor of the first set of four rows having output regions of the second conductivity type separated by portions of the semiconductor body and having a U-shaped gate electrode separated from a top surface of the semiconductor body by a dielectric layer. The first, second, and third isolation regions extend from the top surface of the semiconductor body into same and being separated by first and second portions of the semiconductor body in which active portions of the transistors exist. Each U-shaped gate electrode of the first four rows has right and left arms and a central portion which connects a right arm portion to a left arm portion; and each of the right and left arms having an end portion and a middle portion with the middle portion being adjacent the central portion. The end portions of the right and left arms of the U-shaped gate electrodes of the first row are located over portions of the first isolation region, and the middle portions of the right and left arms of the first row and the central portions of the first row are located over the first portion of the semiconductor body. The end portions of the right and left arms of the U-shaped gate electrodes of the second row are located over portions of the second isolation region, and the middle portions of the right and left arms of the second row and the central portions of the second row are located over the first portion of the semiconductor body. A second portion of the semiconductor body is located between the second isolation region and a third isolation region. The third and fourth rows of transistors are essentially the same as the transistors of the first and second rows. The third and fourth rows of transistors have the same orientation of left and right arms of their U-shaped gate electrodes as in the U-shaped gate electrodes of the transistors of the first and second rows of transistors. The end portions of the right and left arms of the U-shaped gate electrodes of the third row are located over portions of the second isolation region, and the middle portions of the right and left arms of the third row and the central portions of the third row are located over the second portion of the semiconductor body. The end portions of the right and left arms of the U-shaped gate electrodes of the fourth row are located over portions of the third isolation region, and the middle portions of the right and left arms of the fourth row and the central portions of the fourth row are located over the second portion of the semiconductor body. A center of a left arm of a U-shaped gate electrode of a transistor of the third row of transistors is located below a center of a central portion of a U-shaped gate electrode of a transistor of the second row of transistors, and a center of a right arm of a U-shaped gate electrode of a transistor of the third row of transistors is located beneath a center of a space between adjacent U-shaped gate electrodes of the second row of transistors. A second set of four rows of field effect transistors is located in a portion of the semiconductor region with each transistor of the second set of four rows having output regions of the first conductivity type separated by portions of the semiconductor region and having a U-shaped gate electrode separated from a top surface of the semiconductor region by a dielectric layer. The fourth, fifth, and sixth isolation regions extending from the top surface of the semiconductor region into same and being separated by first and second portions of the semiconductor region in which active portions of the transistors are located. The second set of four rows of transistors is essentially the same as the first set of four rows of transistors and having the same orientation relative to the fourth, fifth, and sixth isolation regions and the first and second portions of the semiconductor region as the first set of four rows has to the first, second, and third isolation regions and the first and second portions of the semiconductor body. The conductive lines selectively contact gate electrodes and output regions of the field effect transistors of the first and second set of four rows so as to facilitate the semiconductor structure serving as a plurality of latch circuits of sense amplifiers. An array of memory cells having bit lines coupled thereto and to the conductive lines which contact the latch circuits.

From a third aspect, the present invention is directed to a semiconductor structure. The semiconductor structure comprises a semiconductor body of a first conductivity type, a set of four rows of field effect transistors, first, second, and third isolation regions, conductive lines, and an array of memory cells. The set of four rows of field effect transistors is located in a portion of the semiconductor body with each transistor of the set of four rows having output regions of the second conductivity type separated by portions of the semiconductor body and having a U-shaped gate electrode separated from a top surface of the semiconductor body by a dielectric layer. The first, second, and third isolation regions extend from the top surface of the semiconductor body into same and being separated by first and second portions of the semiconductor body in which active portions of the transistors exist. Each U-shaped gate electrode of the four rows has right and left arms and a central portion which connects a right arm portion to a left arm portion; and each of the right and left arms having an end portion and a middle portion with the middle portion being adjacent the central portion. The end portions of the right and left arms of the U-shaped gate electrodes of the first row are located over portions of the first isolation region, and the middle portions of the right and left arms of the first row and the central portions of the first row are located over the first portion of the semiconductor body. The end portions of the right and left arms of the U-shaped gate electrodes of the second row are located over portions of the second isolation region, and the middle portions of the right and left arms of the second row and the central portions of the second row are located over the first portion of the semiconductor body. A second portion of the semiconductor body is located between the second isolation region and a third isolation region. The third and fourth rows of transistors are essentially the same as the transistors of the first and second rows. The third and fourth rows of transistors have the same orientation of left and right arms of their U-shaped gate electrodes as in the U-shaped gate electrodes of the transistors of the first and second rows of transistors. The end portions of the right and left arms of the U-shaped gate electrodes of the third row are located over portions of the second isolation region, and the middle portions of the right and left arms of the third row and the central portions of the third row are located over the second portion of the semiconductor body. The end portions of the right and left arms of the U-shaped gate electrodes of the fourth row are located over portions of the third isolation region, and the middle portions of the right and left arms of the fourth row and the central portions of the fourth row are located over the second portion of the semiconductor body. A center of a left arm of a U-shaped gate electrode of a transistor of the third row of transistors is located below a center of a central portion of a U-shaped gate electrode of a transistor of the second row of transistors, and a center of a right arm of a U-shaped gate electrode of a transistor of the third row of transistors is located beneath a center of a space between adjacent U-shaped gate electrodes of the second row of transistors. The conductive lines selectively contact gate electrodes and output regions of the field effect transistors of the first and second set of four rows so as to facilitate the semiconductor structure serving as a plurality of latch circuits of sense amplifiers. An array of memory cells having bit lines coupled thereto and to the conductive lines which contact the latch circuits.

The invention will be better understood from the following more detailed description in conjunction with the accompanying drawing.

Figure 1:
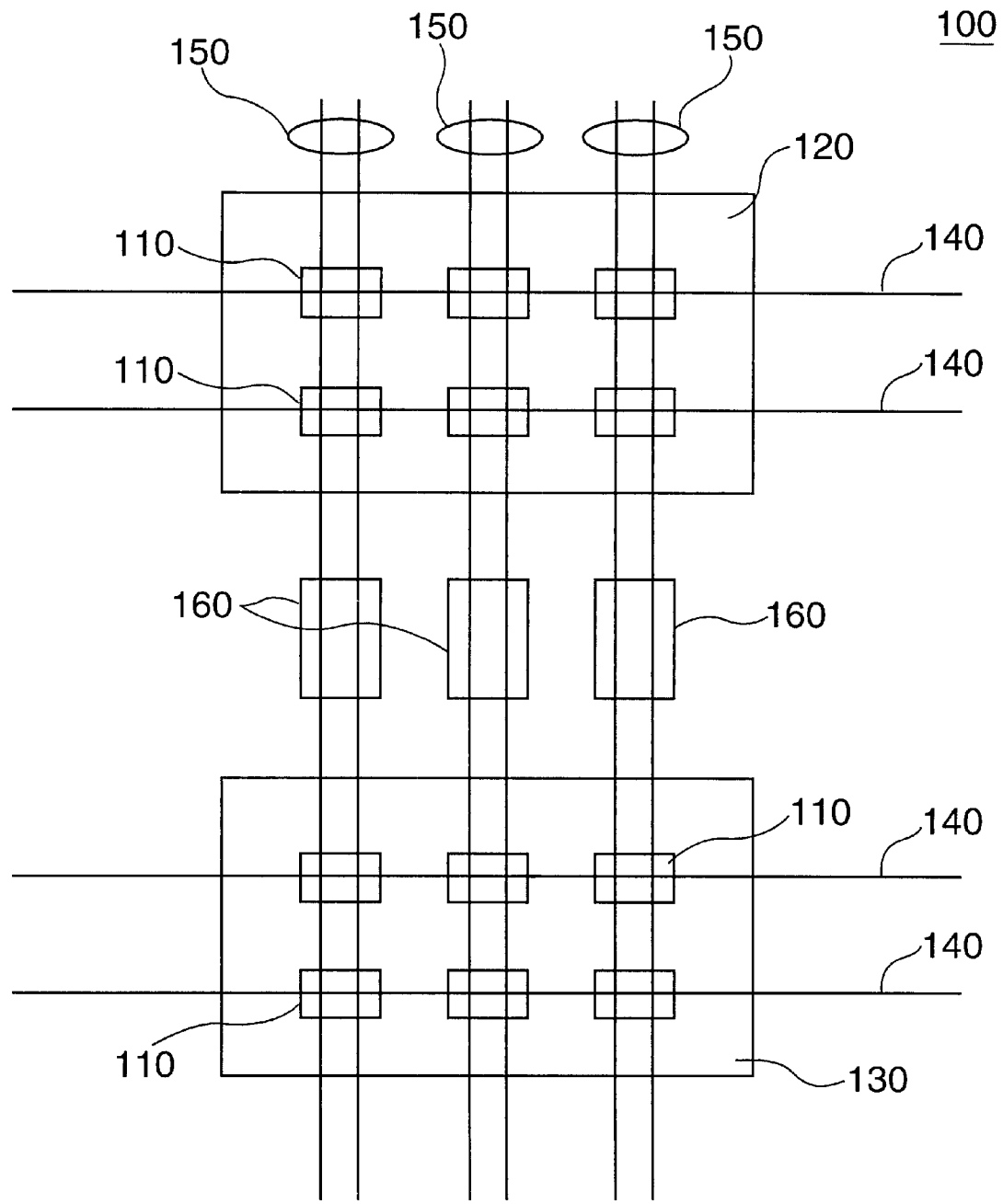
FIG. 1 shows a schematic block diagram of a prior art memory circuit which can be used in conjunction with the present invention.

The drawing may not be to scale.

DETAILED DESCRIPTION

Figure 2A:
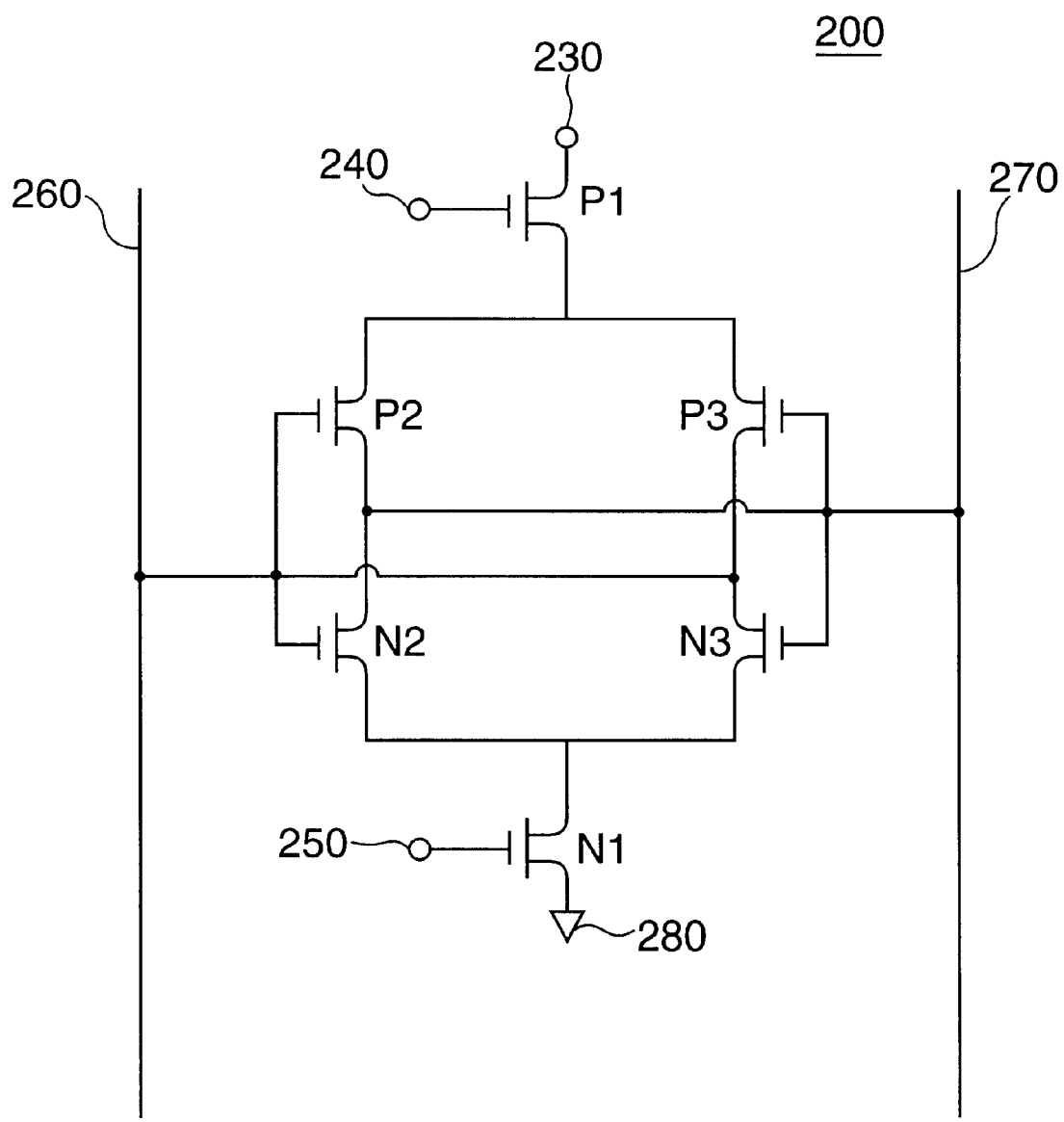
FIG. 2A shows a circuit diagram of a prior art sense amplifier which can be used in conjunction with the present invention.
Figure 3:
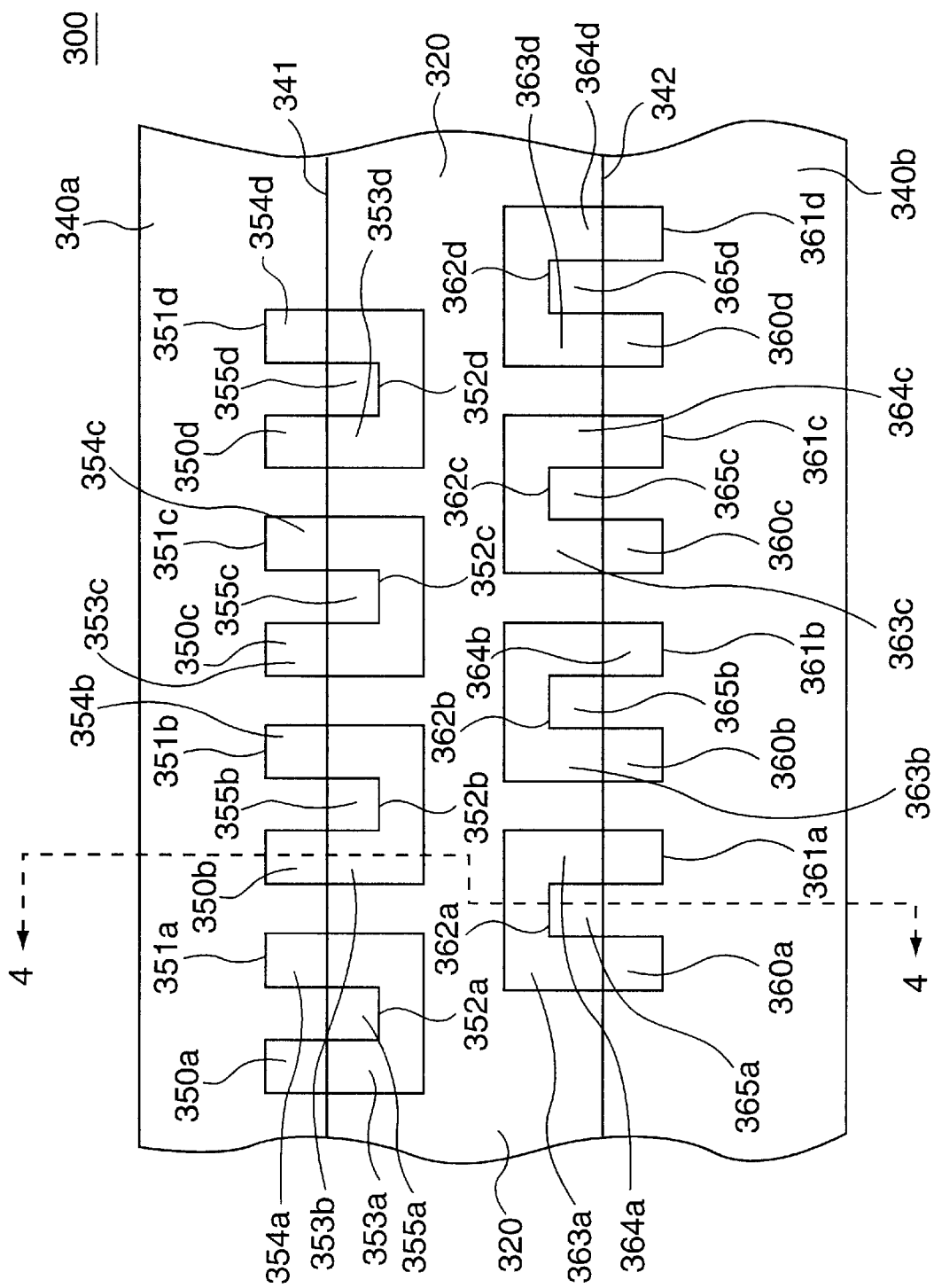
FIG. 3 shows a top view of a portion of a sense amplifier in accordance with the present invention.
Figure 4:
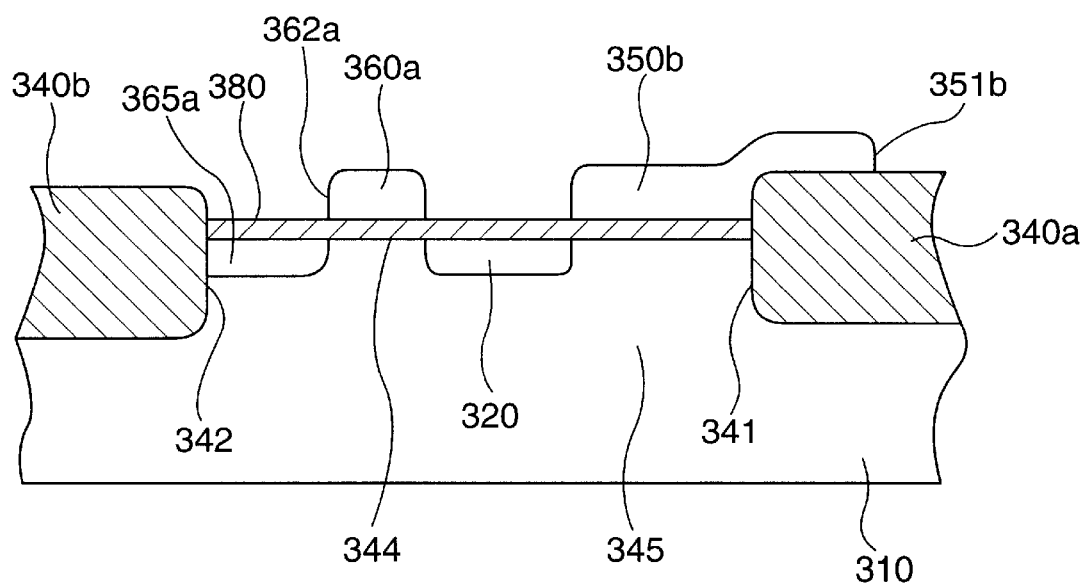
FIG. 4 shows a sectional view of the portion of a sense amplifier shown in FIG. 3.

FIGS. 3 and 4 show a top view of a portion 300, and a cross-sectional view through a dashed line 4—4 of FIG. 3, of a portion of a sense amplifier which utilizes the principles of the present invention. FIG. 3 shows a portion of an array of insulated gate field effect transistors [also denoted as Metal-Oxide-Semiconductor (MOS) transistors] which can be used to form the latch circuits (transistors P2, P3, N2, and N3 of FIG. 2A) and switching transistors (P1 and N1) of FIG. 2A. Portion 300 comprises a semiconductor body 310 of a first conductivity type. A layer with portions 340a and 340b, typically of thick silicon dioxide, has been formed on selected portions of semiconductor body 310 and forms shallow trench isolated regions. Between these portions 340a and 340b transistors are formed in semiconductor body 310. No transistor action will take place in the portion of the semiconductor body 310 where silicon dioxide layers 340a and 340b have been formed. The silicon dioxide layer 340a has a vertical edge 341 (see FIG. 4), and the silicon dioxide layer 340b has a vertical edge 342 (see FIG. 4). A portion 345 of the semiconductor body 310 is bounded by the edges 341 and 342. A layer 380 of a gate dielectric, typically silicon dioxide, has been formed on an upper surface 344 of portion 345 of the semiconductor body 310. Transistor action can occur in portion 345. Portions of the region 345 are covered by a first row of conductive gate electrodes comprising individual gate electrodes 350a, 350b, 350c, and 350d, and a second row of conductive gate electrodes comprising individual gate electrodes 360a, 360b, 360c, and 360d. These electrodes will be the gates of the transistors which are to be formed in the region 345. Each gate electrode 350a–d or 360a–d comprises a first edge, a second edge, a left portion, and a right portion. For example, gate electrode 350a has a first edge 351a, a second edge 352a, a left portion 353a, and a right portion 354a. Gate electrode 360a has a first edge 361a, a second edge 362a, a left portion 363a, and a right portion 364a. The portions of region 345 which are not covered by gate electrodes 350a–d or 360a–d have had formed in them regions of a second, opposite, conductivity type, to form common output region 320 and discrete output regions 355a–d and 365a–d. Output region 355d, for example, is adjacent to gate electrode 350d.

The common region 320 and discrete regions 355a–d and 365a–d are designated as output regions rather than using the more common source and drain nomenclature since the designation of drain or source is a function of the direction of current flow through a field effect transistor, and the source and drain designation reverses if the current flow reverses. In the usage, described herein below, of the transistors containing gate electrodes 350a–d and 360a–d some of the transistors may have current flowing from one of the discrete output regions 355a–d or 365a–d into the common output region 320, and others of the transistors may have current flowing from the common output region 320 into one or more of the discrete output regions 355a–d or 365a–d.

The gate electrodes 350a–d and 360a–d which comprise the first and second rows, respectively, of gate electrodes, are unique in several ways. For example, the gate electrode 350a is of a U-shape. An end 351a of gate electrode 350a terminates on the silicon dioxide region 340a. An output region 355a is defined by a portion of an edge 352a of the gate electrode 350a and a portion of the edge 341 of the silicon dioxide region 340. The gate electrodes 350a–d and 360a–d are further unique in that the first row of gate electrodes 350a–d are laterally displaced with respect to the second row of gate electrodes 360a–d so that, for example, the left arm 363a of gate 360a is coincident with the right arm 354a of gate electrode 350a (see FIG. 3), and the left arm 353d of gate electrode 350d is coincident with the right arm 364c of gate electrode 360c (see FIG. 3).

Figure 2B:
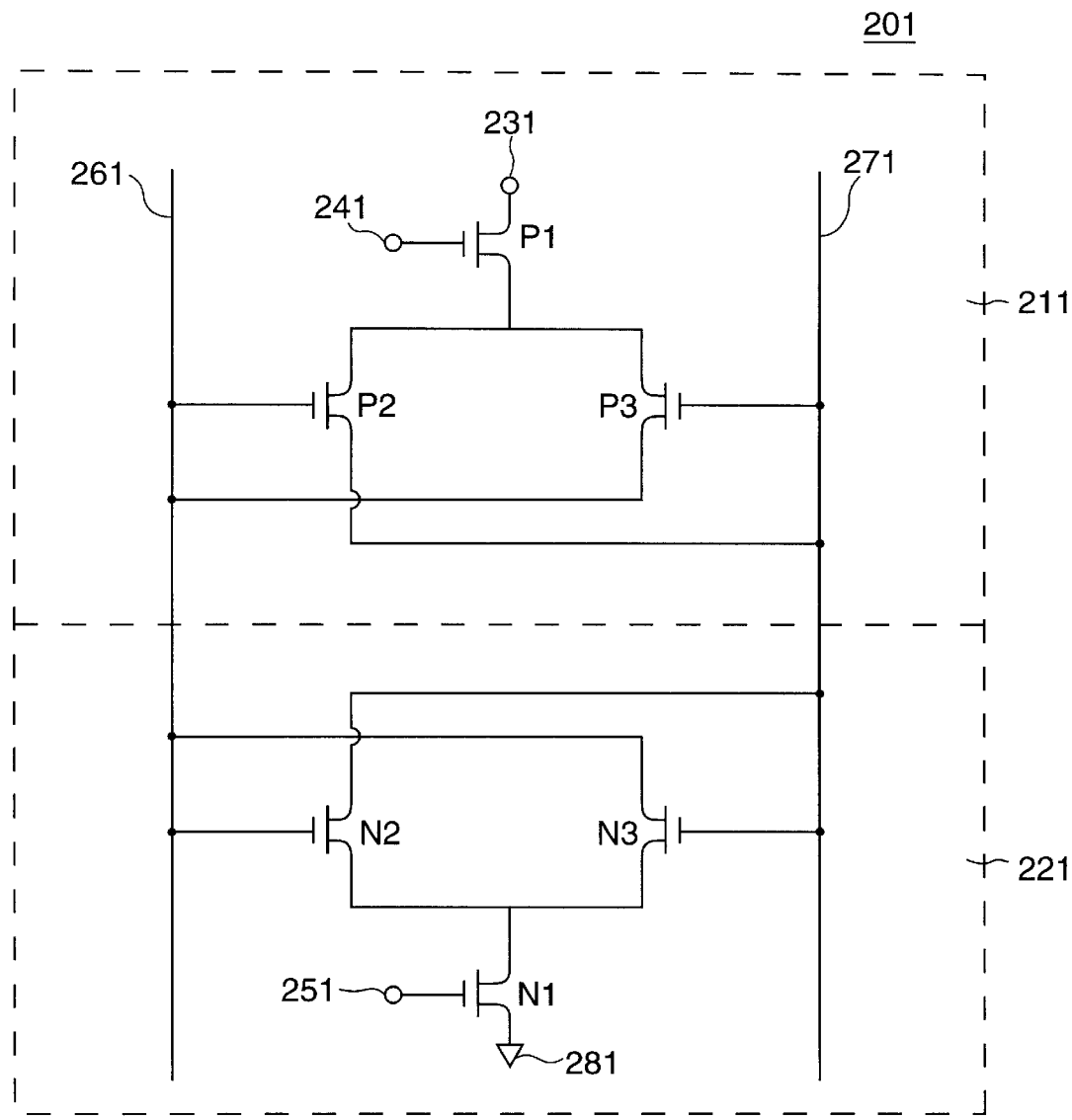
FIG. 2B shows the prior art circuit of FIG. 2A in a manner so as to separate n-channel MOS and p-channel MOS transistors thereof into separate regions.
Figure 5:
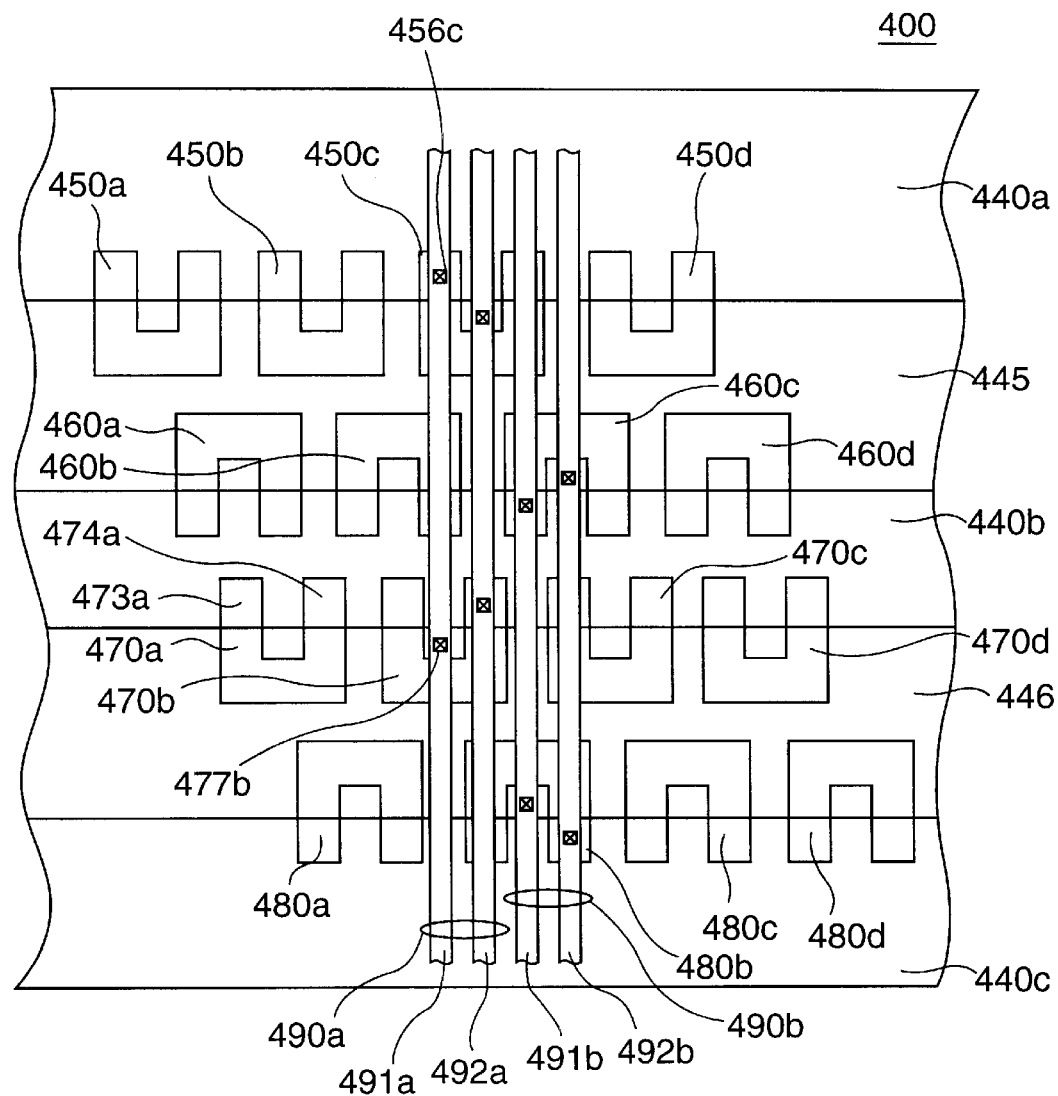
FIG. 5 shows a top view of offset regions of a sense amplifier along with the overlying bit lines in accordance with the present invention.

FIG. 5 shows a top view of a portion of a semiconductor structure 400 comprising two sets of the features of the portion of a sense amplifier 300 shown in FIG. 3. Features of FIG. 5 which have a function equivalent to similar features in FIGS. 3 and 4 have a reference number which is 100 greater than the reference number of the similar feature in FIGS. 3 and 4. The two sets of a portion 300 of a sense amplifier will be used to form transistors of a single type, n-channel MOS transistors or p-channel MOS transistors. Thus we are only implementing in FIG. 5 either the p-channel MOS transistors, P2 and P3 shown in FIGS. 2A and 2B, of the latch circuit, or the n-channel MOS transistors, N2 and N3 shown on FIGS. 2A and 2B. In order to form the complete CMOS latch circuit as shown in FIGS. 2A and 2B a second, similar, portion of the sense amplifier as shown in FIG. 5 must be implemented but with the opposite type of transistor. If it is desired to fabricate a CMOS latch circuit as shown in FIGS. 2A and 2B, and the transistors formed in FIG. 5 are, for example, p-channel MOS transistors, then a second portion must also be implemented, identical to the first portion except that the transistors must be n-channel MOS transistors, and vice versa.

Three regions of silicon dioxide, comprising regions 440a, 440b, and 440c, are shown. Lying between these three regions of silicon dioxide 440a, 440b, and 440c are two regions 445 and 446 of the semiconductor body where transistors may be formed. First and second rows of gate electrodes, comprising gate electrodes 450a–d and 460a–d have been formed in region 445, and third and fourth rows of gate electrodes, comprising gate electrodes 470a–d and 480a–d, have been formed in region 446. The gate electrodes 470a–d and 480a–d are further laterally displaced from the gate electrodes 450a–d and 460a–d so that, for example, the left arm 473a of gate electrode 470d is coincident with the center of gate 460a, and the right arm 474a of a gate electrode 470a is coincident with the center of a gate 450b. The gate electrodes 480a–d have the same lateral relationship with respect to gate electrodes 470a–d as do gate electrodes 460a–d with respect to gate electrodes 450a–d, and gate electrodes 460a–d have the same lateral relationship with respect to gate electrodes 450a–d as gate electrodes 360a–d have to 350 a–d.

Also shown in schematic form in FIG. 5 are pairs of bit lines comprising Data Bit Lines and Reference Bit Lines. A Data Bit Line 491a of bit line pair 490a is shown making contact 456c to gate electrode 450c and contact 477b to an output region of a transistor formed by gate electrode 470b. Reference Bit Line 492a is shown making contact to an output region of a transistor formed by gate electrode 450c and to a gate electrode 470b. The transistors which include the gate electrodes 450c and 470b are two of the transistors forming a latch circuit, for example, p-channel MOS transistors P2 and P3 of FIG. 2B, connected to the bit line pair 490a. Similarly, Data Bit Line 491b of a bit line pair 490b is shown making contact to gate electrode 460c and to an output region of a transistor containing gate electrode 480b. Reference Bit Line 492b is shown making contact to an output region of the transistor formed by gate electrode 460c and to gate electrode 480b. The transistors containing the gate electrodes 460c and 480b are two of the transistors connected to the bit line pair 490b. Because of the manner in which the gate electrodes 450a–d, 460a–d, 470a–d and 480a–d have been laterally offset with respect to one another, the bit lines 491a, 492a, 491b, and 492b can be fabricated on a single level of conductor, and with no lateral displacements or protuberances required in order to be able to contact the individual gates and output regions of the latch transistors. This means that each of the bit lines 491a, 492a, 491b, and 492b is essentially a straight rectangular conductor of minimum width. This reduces the capacitive loading of the bit lines 491a, 492a, 491b, and 492b.

Additional pairs of bit lines may be added to form an array of bit lines which mate with the rows of transistors 450a–d, 460a–d, 470a–d, and 480a–d, until all the bit line pairs emanating from the memory cell arrays have been mated to the appropriate latch transistors of a sense amplifier.

The portion of a sense amplifier shown schematically in FIG. 5 has achieved a width equal to the width of one bit line pair, or 2P. This sense amplifier layout achieves the goal of being equivalent in size to the smallest memory cell arrays.

Figure 6:
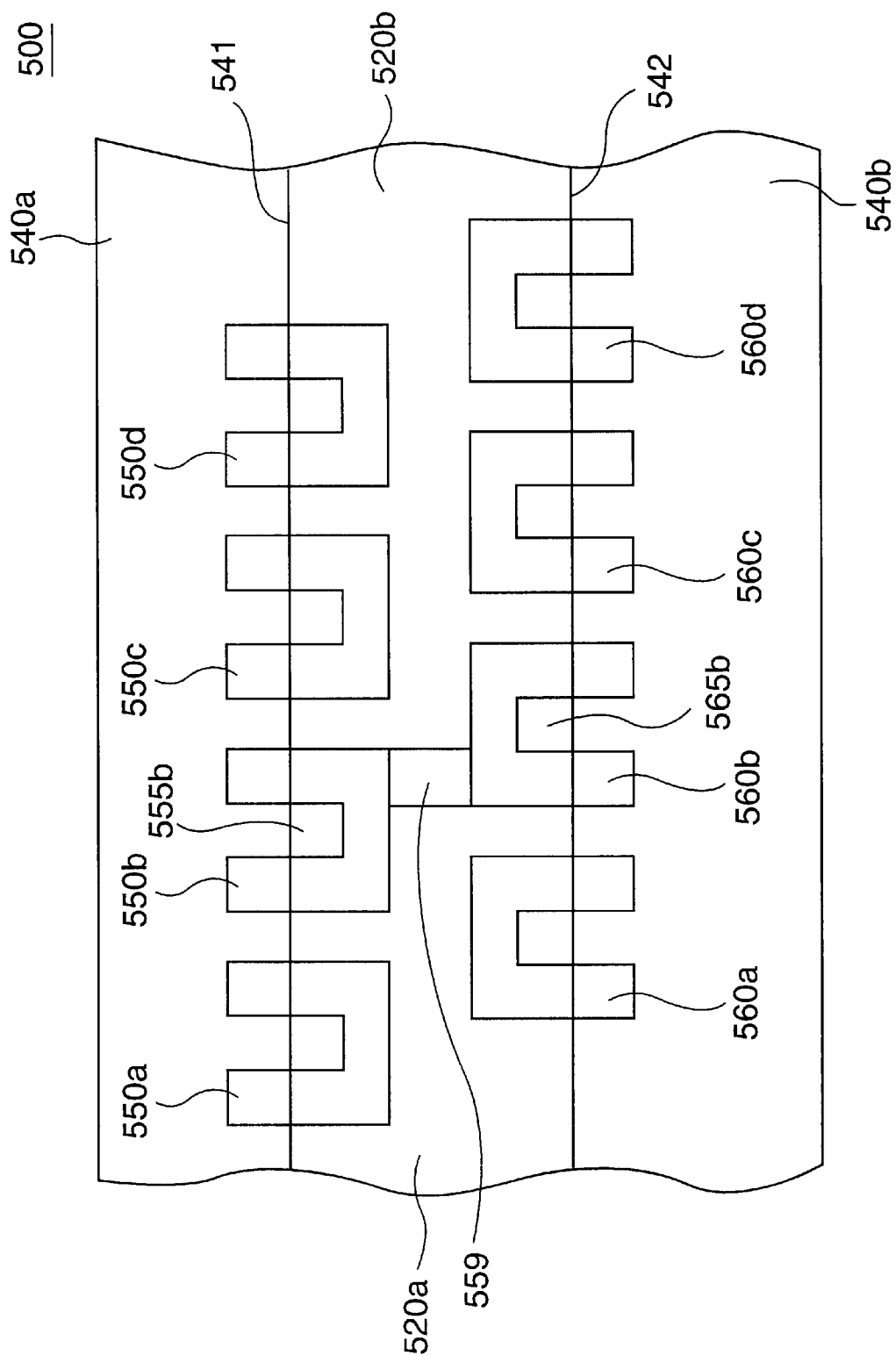
FIG. 6 shows a top view of a portion of a sense amplifier which includes switch transistors in accordance with the present invention.

FIG. 6 is a top view of a portion of a semiconductor structure 500 showing the layout of a portion of an array of transistors, similar to that shown in FIG. 3, in which a portion of the transistors have been dedicated to the switch transistor function of transistors N1 or P1 shown in FIGS. 2A and 2B. Features of FIG. 6 which have a function equivalent to similar features in FIGS. 3 and 4 have a reference number which is 200 greater than the reference number of the similar feature in FIGS. 3 and 4. In FIG. 6 gate electrodes 550a, 550c, 550d, 560a, 560c, and 560d remain similar to their counterparts in FIG. 3, i.e., 350a, 350c, 350d, 360a, 360c, and 360d, respectively. Gate electrodes 550b and 560b have been connected together by a gate electrode conductor 559 and function as a gate electrode of a switch transistor. Output regions 555b and 565b are connected together (not shown) such that two separate transistors, i.e., one in the top row and one in the bottom row act as a single transistor. Conductor 559 separates a common output region (see common output region 320 in FIGS. 3 and 4) of the transistors 550a–d and 560a–d into two common output 520a and 520b. If an appropriate potential is applied to the gate conductor comprising gate conductors 550b, 560b, and 559 to invert the semiconductor surface underneath these gate conductors, then the discrete output regions 555b and 565b will be connected through an inversion layer created underneath the gate conductors 550b, 560b, and 559 to the common output regions 520a and 520b. Thus, if the gate conductors 550b, 560b, and 559 are connected to an enable/disable signal, and the regions 555b and 565b of the transistors formed by gate electrodes 550b and 560b are connected to power, the transistors formed by gate electrodes 550b and 560b can function as the switch transistors P1, or if the regions 555b and 565b of the transistors formed by gate electrodes 550b, 560b, and 559 are connected to ground, the transistors formed by gate electrodes 550b and 560b can function as the switch transistors N1 of FIGS. 2A and 2B. The coupling together of the two transistors having gate electrodes 350b and 360b provides more current drive capability than if a single transistor having gate electrode 350b were used to accomplish the function of the switch transistor N1 or P1 in FIGS. 2A and 2B. This is particularly useful since the layout provided would typically not use the transistor having gate electrode 560b unless it is specifically coupled to the transistor having gate electrode 550b.

Figure 7:
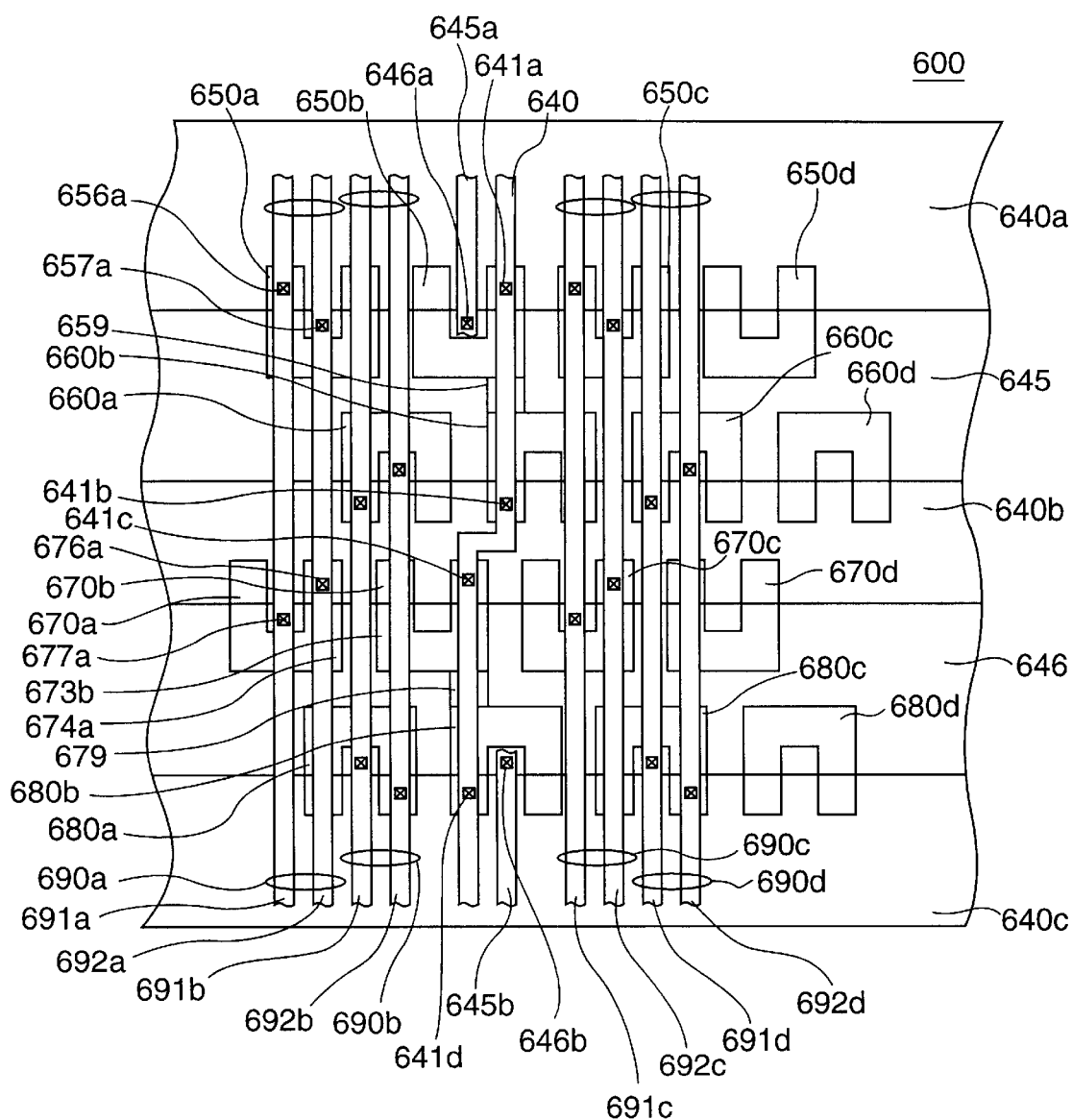
FIG. 7 shows a top view of a portion of a sense amplifier which includes switch transistors along with the overlying bit lines, enable/disable signal lines, and power or ground lines in accordance with the present invention.

FIG. 7 shows a top view of a portion of a semiconductor structure 600 comprising two sets of the features of the portion of a sense amplifier 500 shown in FIG. 6. Features of FIG. 7 which have a function equivalent to similar features in FIGS. 3 and 4, FIG. 5, or FIG. 6 have a reference number which is 300, 200, or 100, respectively, greater than the reference number of the similar feature in FIGS. 3 and 4, FIG. 5, or FIG. 6. Two sets of a portion 500 of a sense amplifier will be used to form transistors of a single type, n-channel MOS transistors or p-channel MOS transistors. Thus we are only implementing in FIG. 7 either the p-channel MOS transistors, P1, P2, and P3 shown in FIGS. 2A and 2B, of the sense amplifier, or the n-channel MOS transistors, N1, N2, and N3 shown on FIGS. 2A and 2B, of the sense amplifier. In order to form the complete CMOS sense amplifier as shown in FIGS. 2A and 2B, a second, similar, portion of the sense amplifier shown in FIG. 7 must be implemented, but with the opposite conductivity type transistor. If it is desired to fabricate a CMOS sense amplifier as shown in FIGS. 2A and 2B, and the transistors formed in FIG. 7 are, for example, p-channel MOS transistors, then a second portion must also be implemented, identical to the first portion except that the transistors must be n-channel MOS transistors, and vice versa.

Three regions of silicon dioxide, comprising regions 640a, 640b, and 640c, are shown. Lying between these three regions of silicon dioxide 640a, 640b, and 640c are two regions 645 and 646 of the semiconductor body where transistors may be formed. First and second rows of gate electrodes, comprising gate electrodes 650a–d and 660a–d have been formed in region 645, and third and fourth rows of gate electrodes, comprising gate electrodes 670a–d and 680a–d, have been formed in region 646. The gate electrodes 670a–d and 680a–d have been further laterally displaced from the gate electrodes 650a–d and 660a–d so that, for example, the left arm 673b of a gate electrode 670b is coincident with the center (or middle portion) of a gate 660a and the right arm 674a of a gate electrode 670a is coincident with the center (or middle portion) of a gate 650a. The gate electrodes 680a–d have the same lateral relationship with respect to gate electrodes 670a–d as do gate electrodes 660a–d with respect to gate electrodes 650a–d, and gate electrodes 660a–d have the same lateral relationship with respect to gate electrodes 650a–d as gate electrodes 360a–d have to 350a–d.

A conductor 640 which is connected to the switch enable/disable signal (not shown) contacts gate electrodes 650b and 660b at contacts 641a and 641b. The conductor 640 also contacts gate electrodes 670b and 680b at contacts 641c and 641d. The conductor 640 may be connected to a second level metal conductor (not shown) to facilitate the distribution of the switch enable/disable signal. A conductor 645a, which is connected to either the power source or ground, contacts the output region of the transistor formed by gate electrode 650b at contact 646a. A conductor 645b, which is also connected to the same reference potential as the conductor 645a, either the power source or ground, contacts the output region of transistor 680b at contact 646b. Conductors 646a and 646b may be connected to the power source or ground through a second level metal conductor (not shown) to facilitate the distribution of power and ground on the circuit. Although not shown in FIG. 7, the output regions of transistors 660b and 670b may also be contacted by conductors which are connected to the appropriate reference potential, either the power source or ground.

Four pairs of bit lines, 690a, 690b, 690c, and 690d, are shown in FIG. 7. Each pair of bit lines consists of a Data Bit Line and a Reference Bit Line, e.g., 691a and 692a, respectively. The pairs of bit lines 690a–d make contact with the appropriate gate electrode and output regions to form the latch circuits of the sense amplifiers, as described above and shown in FIG. 5. For example, Data Bit Line 691a makes contact with a gate electrode 650a at a contact 656a, and makes contact with an output region of the transistor formed by a gate electrode 670a at a contact 677a, and Reference Bit Line 692a makes contact with an output region of the transistor formed by a gate electrode 650a at a contact 657a, and makes contact with a gate electrode 670a at a contact 676a.

The use, for example, of one of the transistors 650b of the array of transistors 650a–d to perform the function of the switch transistor N1 or P1 of FIGS. 2A and 2B increases the average pitch of the sense amplifiers formed in the arrangement depicted in FIG. 7. For this reason, a minimal number of transistors, as determined by the performance of the circuit, should be dedicated to the switch transistor function. To obtain the absolute minimum pitch of the sense amplifiers, the use of the arrangement of FIG. 5 is preferred, with the switch transistors being fabricated in another portion of the circuit. For example, the switch transistors could be fabricated in the regions 440a, 440b, or 440c of FIG. 5, and appropriate connection made to the output regions of the transistors of FIG. 5.

It is to be understood that the specific embodiments described herein are illustrative of the general principles of the invention and that various modifications may be devised in the apparatus without departing from the spirit and scope of the present invention. For example, while the present invention has been described within the context of a memory circuit fabricated using a CMOS technology and embodying both p-channel and n-channel MOS transistors, the principles of the invention could also be applied to a memory circuit employing a single type of transistor, either n-channel or p-channel MOS transistors. Further, while one method of laterally offsetting the rows of transistors has been describe in the present embodiments, other structural arrangements of laterally offsetting the transistors, or even no lateral offset of the transistors, might be employed to facilitate the desired layout of the pairs of bit lines. Furthermore, while one structural arrangement of interconnecting the transistors to perform the switch transistor function has been described, other methods may be devised to achieve this function. Additionally, while the gates of the transistors have been shown schematically with the width of the gate conductor similar in size to the space between different gate conductors and between portions of the same conductor, it is to be understood that these three feature sizes may be varied to optimize both the size and the manufacturing yield of the circuit. Specifically, the space between edges of a gate conductor in which a contact to an output region is to be made may be different than the space between edges of a gate conductor in which no such contact is made.

What is claimed is:

1. A semiconductor structure comprising:
   two rows of field effect transistors with each transistor having output regions of a first conductivity type separated by portions of a semiconductor body of a second opposite conductivity type and having a U-shaped gate electrode separated from a top surface of the semiconductor body by a dielectric layer;
   first and second isolation regions extending from the top surface of the semiconductor body into same and being separated by a first portion of the semiconductor body in which active portions of the transistors exist;
   each U-shaped gate electrode having right and left arms and a central portion which connects a right arm portion to a left arm portion; and each of the right and left arms having an end portion and a middle portion with the middle portion being adjacent the central portion;
   the end portions of the right and left arms of the U-shaped gate electrodes of the first row being located over portions of the first isolation region, and the middle portions of the right and left arms of the first row and the central portions of the first row being located over the first portion of the semiconductor body;
   the end portions of the right and left arms of the U-shaped gate electrodes of the second row being located over portions of the second isolation region, and the middle portions of the right and left arms of the second row and the central portions of the second row being located over the first portion of the semiconductor body;
   the U-shaped gate electrodes of the second row of transistors being displaced from the U-shaped gate electrodes of the first row with a left arm of a gate electrode of a transistor of the second row being located below a right arm of a gate electrode of a transistor of the first row and a right arm of a gate electrode of a transistor of the second row being located below a left arm of a gate electrode of a transistor of the first row.

2. The semiconductor structure of claim 1 further comprising:
   a second portion of the semiconductor body being located between the second isolation region and a third isolation region;
   third and fourth rows of transistors which are essentially the same as the transistors of the first and second rows, the third and fourth rows of transistors having the same orientation of left and right arms of their U-shaped gate electrodes as in the U-shaped gate electrodes of the transistors of the first and second rows of transistors;
   the end portions of the right and left arms of the U-shaped gate electrodes of the third row being located over portions of the second isolation region, and the middle portions of the right and left arms of the third row and the central portions of the third row being located over the second portion of the semiconductor body;
   the end portions of the right and left arms of the U-shaped gate electrodes of the fourth row being located over portions of the third isolation region, and the middle portions of the right and left arms of the fourth row and the central portions of the fourth row being located over the second portion of the semiconductor body; and
   a center of a left arm of a U-shaped gate electrode of a transistor of the third row of transistors being located below a center of a central portion of a U-shaped gate electrode of a transistor of the second row of transistors, and a center of a right arm of a U-shaped gate electrode of a transistor of the third row of transistors being located beneath a center of a space between adjacent U-shaped gate electrodes of the second row of transistors.

3. The semiconductor structure of claim 2 further comprising:
   a semiconductor region of the first conductivity type located in a portion of the semiconductor body, the semiconductor region having formed therein fourth, fifth, and sixth isolation regions separated by first and second portions of the semiconductor region;
   four additional rows of field effect transistors being essentially the same as the first four rows of transistors but having output regions of the second conductivity type and being located in a portion of the semiconductor region; and
   the additional four rows of field effect transistors having essentially the same orientation relative to each other as the first four rows of field effect transistors, and having portions thereof located in the fourth, fifth, and sixth isolation regions and the first and second portions of the semiconductor region as are the first four rows located in the first, second and third isolation regions and the first and second portions of the semiconductor body.

4. The semiconductor structure of claim 3 wherein the first conductivity type is n-type and the second opposite conductivity type is p-type.

5. The semiconductor structure of claim 4 further comprising a plurality of conductive lines which selectively contact gate electrodes and output regions of the field effect transistors so as to facilitate the semiconductor structure serving as a plurality of latch circuits of sense amplifiers.

6. The semiconductor structure of claim 5 further comprising an array of memory cells with the conductive lines being coupled to the memory cells and serving as bit lines.

7. The semiconductor structure of claim 6 wherein the pitch of the field effect transistors of each of the rows is approximately equal to four times the pitch of the conductive lines.

8. The semiconductor structure of claim 4 further comprising conductive lines which selectively contact gate electrodes and output regions of the field effect transistors so as to facilitate the semiconductor structure serving as a plurality of sense amplifiers.

9. The semiconductor structure of claim 8 wherein the pitch of the field effect transistors of each of the rows is approximately equal to four times the pitch of the conductive lines.

10. The semiconductor structure of claim 9 further comprising an array of memory cells having bit lines coupled to some of the conductive lines.

11. The semiconductor structure of claim 3 wherein the field effect transistors are insulated gate field effect transistors.

12. The semiconductor structure of claim 2 wherein the insulate d field effect transistors are n-channel transistors.

13. The semiconductor structure of claim 2 wherein the insulated field effect transistors are p-channel transistors.

14. The semiconductor structure of claim 4 wherein the first four rows of transistors are n-channel insulated gate transistors and the additional four rows of transistors are p-channel insulated gate field effect transistors.

15. The semiconductor structure of claim 3 wherein the first, second, third, fourth, fifth, and sixth isolation regions are shallow trench isolation regions.

16. The semiconductor structure of claim 15 wherein the shallow trench isolation regions are silicon dioxide.

17. The semiconductor structure of claim 3 wherein the third and fourth isolations region are merged into a single isolation region.

18. A semiconductor structure comprising:
a semiconductor body of a first conductivity type;
a semiconductor region of a second opposite conductivity type being located within a portion of the semiconductor body;
a first set of four rows of field effect transistors located in a portion of the semiconductor body not occupied by the semiconductor region with each transistor of the first set of four rows having output regions of the second conductivity type separated by portions of the semiconductor body and having a U-shaped gate electrode separated from a top surface of the semiconductor body by a dielectric layer;
first, second, and third isolation regions extending from the top surface of the semiconductor body into same and being separated by first and second portions of the semiconductor body in which active portions of the transistors exist;
each U-shaped gate electrode of the first four rows having right and left arms and a central portion which connects a right arm portion to a left arm portion; and each of the right and left arms having an end portion and a middle portion with the middle portion being adjacent the central portion;
the end portions of the right and left arms of the U-shaped gate electrodes of the first row being located over portions of the first isolation region, and the middle portions of the right and left arms of the first row and the central portions of the first row being located over the first portion of the semiconductor body;
the end portions of the right and left arms of the U-shaped gate electrodes of the second row being located over portions of the second isolation region, and the middle portions of the right and left arms of the second row and the central portions of the second row being located over the first portion of the semiconductor body;
a second portion of the semiconductor body being located between the second isolation region and a third isolation region;
the third and fourth rows of transistors being essentially the same as the transistors of the first and second rows, the third and fourth rows of transistors having the same orientation of left and right arms of their U-shaped gate electrodes as in the U-shaped gate electrodes of the transistors of the first and second rows of transistors;
the end portions of the right and left arms of the U-shaped gate electrodes of the third row being located over portions of the second isolation region, and the middle portions of the right and left arms of the third row and the central portions of the third row being located over the second portion of the semiconductor body;
the end portions of the right and left arms of the U-shaped gate electrodes of the fourth row being located over portions of the third isolation region, and the middle portions of the right and left arms of the fourth row and the central portions of the fourth row being located over the second portion of the semiconductor body;
a center of a left arm of a U-shaped gate electrode of a transistor of the third row of transistors being located below a center of a central portion of a U-shaped gate electrode of a transistor of the second row of transistors, and a center of a right arm of a U-shaped gate electrode of a transistor of the third row of transistors being located beneath a center of a space between adjacent U-shaped gate electrodes of the second row of transistors;
a second set of four rows of field effect transistors located in a portion of the semiconductor region with each transistor of the second set of four rows having output regions of the first conductivity type separated by portions of the semiconductor region and having a U-shaped gate electrode separated from a top surface of the semiconductor region by a dielectric layer;
fourth, fifth, and sixth isolation regions extending from the top surface of the semiconductor region into same and being separated by first and second portions of the semiconductor region in which active portions of the transistors are located;
the second set of four rows of transistors being essentially the same as the first set of four rows of transistors and having the same orientation relative to the fourth, fifth, and sixth isolation regions and the first and second portions of the semiconductor region as the first set of four rows has to the first, second, and third isolation regions and the first and second portions of the semiconductor body;
conductive lines which selectively contact gate electrodes and output regions of the field effect transistors of the first and second set of four rows so as to facilitate the semiconductor structure serving as a plurality of latch circuits of sense amplifiers; and
an array of memory cells having bit lines coupled thereto and to the conductive lines which contact the latch circuits.

19. The semiconductor structure of claim 18 wherein the conductive lines are essentially straight lines.

20. The semiconductor structure of claim 18 wherein the conduction lines are coupled to the transistors of the rows so as to form switching transistors and latch circuits of a plurality of sense amplifiers.

21. The semiconductor structure of claim 18 wherein:
the first four rows of transistors are p-channel insulated gate field effect transistors and the second four rows of transistors are n-channel insulated gate field effect transistors; and
the semiconductor body is of n-type conductivity and the semiconductor region is of p-type conductivity.

22. The structure of claim 18 wherein the first, second, third, fourth, fifth, and sixth isolation regions are shallow trench isolation regions.

23. The semiconductor structure of claim 22 wherein the shallow trench isolation regions are silicon dioxide.

24. The semiconductor structure of claim 18 wherein the third and fourth isolations region are merged into a single isolation region.

25. A semiconductor structure comprising:

a semiconductor body of a first conductivity type;

a set of four rows of field effect transistors located in a portion of the semiconductor body with each transistor of the set of four rows having output regions of the second conductivity type separated by portions of the semiconductor body and having a U-shaped gate electrode separated from a top surface of the semiconductor body by a dielectric layer;

first, second, and third isolation regions extending from the top surface of the semiconductor body into same and being separated by first and second portions of the semiconductor body in which active portions of the transistors exist;

each U-shaped gate electrode of the four rows having right and left arms and a central portion which connects a right arm portion to a left arm portion; and each of the right and left arms having an end portion and a middle portion with the middle portion being adjacent the central portion;

the end portions of the right and left arms of the U-shaped gate electrodes of the first row being located over portions of the first isolation region, and the middle portions of the right and left arms of the first row and the central portions of the first row being located over the first portion of the semiconductor body;

the end portions of the right and left arms of the U-shaped gate electrodes of the second row being located over portions of the second isolation region, and the middle portions of the right and left arms of the second row and the central portions of the second row being located over the first portion of the semiconductor body;

a second portion of the semiconductor body being located between the second isolation region and the third isolation region;

the third and fourth rows of transistors being essentially the same as the transistors of the first and second rows, the third and fourth rows of transistors having the same orientation of left and right arms of their U-shaped gate electrodes as in the U-shaped gate electrodes of the transistors of the first and second rows of transistors;

the end portions of the right and left arms of the U-shaped gate electrodes of the third row being located over portions of the second isolation region, and the middle portions of the right and left arms of the third row and the central portions of the third row being located over the second portion of the semiconductor body;

the end portions of the right and left arms of the U-shaped gate electrodes of the fourth row being located over portions of the third isolation region, and the middle portions of the right and left arms of the fourth row and the central portions of the fourth row being located over the second portion of the semiconductor body;

a center of a left arm of a U-shaped gate electrode of a transistor of the third row of transistors being located below a center of a central portion of a U-shaped gate electrode of a transistor of the second row of transistors, and a center of a right arm of a U-shaped gate electrode of a transistor of the third row of transistors being located beneath a center of a space between adjacent U-shaped gate electrodes of the second row of transistors;

conductive lines which selectively contact gate electrodes and output regions of the field effect transistors of the four rows so as to facilitate the semiconductor structure serving as a plurality of latch circuits of sense amplifiers; and an array of memory cells having bit lines coupled thereto and to the conductive lines which contact the latch circuits.

26. The semiconductor structure of claim 25 wherein the conductive lines are essentially straight lines.

27. The semiconductor structure of claim 25 wherein the conduction lines are coupled to the transistors of the rows so as to form switching transistors and latch circuits of a plurality of sense amplifiers.

28. The semiconductor structure of claim 25 wherein:

the four rows of transistors are p-channel insulated gate field effect transistors; and the semiconductor body is of n-type conductivity.

29. The semiconductor structure of claim 25 wherein:

the four rows of transistors are n-channel insulated gate field effect transistors; and the semiconductor body is of p-type conductivity.

30. The structure of claim 25 wherein the first, second, and third isolation regions are shallow trench isolation regions.

31. The semiconductor structure of claim 30 wherein the shallow trench isolation regions are silicon dioxide.

* * * * *